(12) United States Patent
McEwen et al.

(10) Patent No.: US 8,082,535 B1
(45) Date of Patent: Dec. 20, 2011

(54) METHOD AND APPARATUS FOR TESTING PROGRAMMABLE INTEGRATED CIRCUITS

(75) Inventors: Ian L. McEwen, Golden, CO (US); Teymour M. Mansour, Sunnyvale, CA (US); Andrew G. Anderson, Fort Collins, CO (US); Reto Stamm, Monte Sereno, CA (US)

(73) Assignee: Xilinx, Inc., San Jose, CA (US)

( * ) Notice: Subject to any disclaimer, the term of this patent is extended or adjusted under 35 U.S.C. 154(b) by 409 days.

(21) Appl. No.: 12/364,667

(22) Filed: Feb. 3, 2009

(51) Int. Cl.
G06F 17/50 (2006.01)
G06F 11/22 (2006.01)

(52) U.S. Cl. .................................................. 716/136

(58) Field of Classification Search .................... 716/136
See application file for complete search history.

(56) References Cited

U.S. PATENT DOCUMENTS

| | | | |
|---|---|---|---|
| 5,475,695 A * | 12/1995 | Caywood et al. | 714/738 |
| 5,808,919 A * | 9/1998 | Preist et al. | 702/183 |
| 6,912,701 B2 * | 6/2005 | Kundu | 716/113 |
| 7,058,919 B1 | 6/2006 | Young et al. | |
| 7,227,364 B1 | 6/2007 | Fan et al. | |
| 7,401,307 B2 * | 7/2008 | Foreman et al. | 716/113 |
| 7,757,198 B1 * | 7/2010 | Zhao et al. | 716/103 |
| 7,987,442 B2 * | 7/2011 | Rajski et al. | 716/136 |
| 2006/0010410 A1 * | 1/2006 | Curtin et al. | 716/6 |
| 2008/0052655 A1 * | 2/2008 | Curtin et al. | 716/6 |
| 2008/0056137 A1 * | 3/2008 | Ravindran et al. | 370/238 |
| 2008/0216036 A1 * | 9/2008 | Foreman et al. | 716/6 |
| 2008/0270954 A1 * | 10/2008 | Habib et al. | 716/5 |

* cited by examiner

*Primary Examiner* — Stacy Whitmore
*Assistant Examiner* — Magid Dimyan
(74) *Attorney, Agent, or Firm* — Scott Hewett; LeRoy D. Maunu; Lois D. Cartier

(57) ABSTRACT

A method of testing an IC generates a test design list of test patterns and produces an arc usage string for each test pattern. The arc usage strings are ranked according to the number of untested arcs in each successive test pattern by comparing each of the remaining arc usage strings against an already-tested arc file to identify the arc usage string (test pattern) having the greatest number of untested arcs. A test sequence list of test patterns ranked in order of the most number of untested arcs to the least number of untested arcs is provided to a tester and the IC is tested in order of the test patterns on the test sequence list.

9 Claims, 4 Drawing Sheets

METHOD AND APPARATUS FOR TESTING PROGRAMMABLE INTEGRATED CIRCUITS

FIELD OF THE INVENTION

The present invention generally relates to programmable integrated circuits, and more specifically to testing functional operation of routing resources.

BACKGROUND OF THE INVENTION

Programmable logic devices, such as field-programmable gate arrays ("FPGAs") and complex programmable logic devices ("CPLDs") have a variety of resources, such as logic, memory, input/output (I/O") interfaces, and routing fabric that can be configured to perform various user-defined operations. Generally, the routing fabric connects sources and destinations together. For example, a block of memory might be connected through a portion of the routing fabric to a configurable logic block, and another portion of the routing fabric might connect the logic block or the memory block to an I/O interface. The routing fabric is essentially a matrix of wires (also called "nodes") and user-selectable (programmable) switches (called "arcs" for purposes of this patent application), that are usually transistors. These transistors allow multiple configurations of the routing fabric, unlike anti-fuse or other types of one-time-programmable switches. Other terms used to describe arcs are programmable interconnect points ("PIPs"), muxes, or simply switches. The routing fabric is implemented as multi-level multiplexers, and each arc represents a path through a mux or set of muxes.

A path between a source and a destination is defined by selecting a sequence of arcs to connect a series of nodes. A typical FPGA might have on the order of one million arcs. This leads to a large number of possible routes through the fabric. A user of the FPGA typically designs an application that is placed and routed on the physical FPGA design. The FPGA manufacturer typically has no knowledge of how the user design will utilize the arcs and nodes of the routing fabric, and thus it is important for the manufacturer to insure that all arcs are valid. In other words, to insure that all arcs operate as expected to selectively connect nodes when the FPGA is configured.

The time required to test all arcs in a physical FPGA is substantial and costly. As the complexity of FPGAs has increased, some devices may exceed the capacity of the test tool (test station) to fully exercise all arcs in a single test sequence.

SUMMARY OF THE INVENTION

This application presents method and system for testing integrated circuits that includes an improved technique for finding failures. The technique employs a unique way of improving utilization of test resources and is able to discover failure sources earlier in the testing process.

A method of testing an IC generates a test design list of test patterns (202) and produces an arc usage string for each test pattern. The arc usage strings are ranked according to the number of untested arcs in each successive test pattern by comparing each of the remaining arc usage strings against an already-tested arc file to identify the arc usage string (test pattern) having the greatest number of untested arcs. A test sequence list of test patterns ranked in order of the most number of untested arcs to the least number of untested arcs is provided to a test system and the IC is tested in order of the test patterns on the test sequence list.

DETAILED DESCRIPTION

Routing fabric of an FPGA, CPLD, or other IC having user-selectable arcs is typically tested by generating a sequence of test designs using a test design tool. The test design tool generates test designs (basically, routing circuits that are placed to the IC so that series of arcs are utilized) and keeps track of the arcs that have been used in each of the test designs. The test design tool continues to generate successive test designs until all of the listed arcs have been utilized. In some instances, some arcs might not be accessible to the user, such as when a portion of the fabric is only accessible by the manufacturer.

Many arcs, such as the arc leading into and out of an I/O block, are used in many of the individual test designs, as those routes are used to access arcs and nodes deeper within the routing fabric. An exemplary test design tool might generate several hundred test designs in order to utilize (test) all of the arcs in the physical IC. Some test designs typically use many more arcs than other test designs, in other words, some test configurations are more extensive than others. The test designs are then loaded into a tester, which runs the test designs in the sequence in which they were loaded.

In a test sequence according to an embodiment, the test designs are ranked before being loaded into the tester (i.e., the physical test system) so that the probability of finding a failed arc earlier in the test sequence is improved. Ranking is done by comparing the test designs against a set of previously tested arcs, and selecting the test design with the greatest number of untested arcs as the next test design run on the tester.

Figure 1:
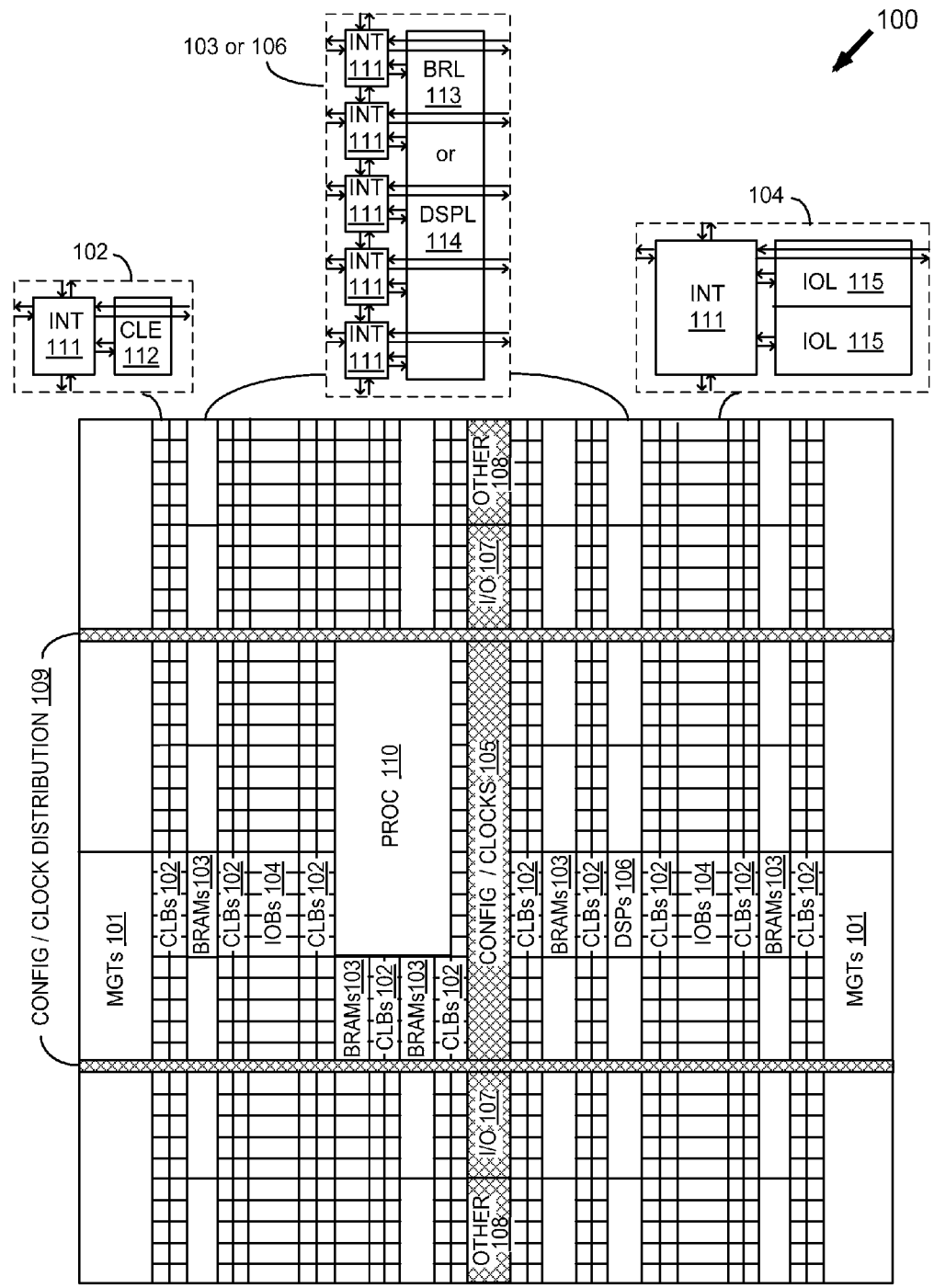
FIG. 1 is a floor plan of an FPGA suitable for testing according to an embodiment of the invention.

FIG. 1 is a floor plan of an FPGA 100 suitable for testing according to an embodiment of the invention. The FPGA 100 includes CMOS portions in several of the functional blocks, such as in RAM and logic, and is fabricated using a CMOS fabrication process. FPGAs are configured to perform the desired function(s) in a variety of ways, such as using an HDL file to configure the hardware (logic and switches) of the FPGA. In a particular embodiment, a complier automatically generates the HDL or other hardware definition to configure the hardware of the FPGA to the desired data stream modification machine (circuit).

The FPGA architecture includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115. In the pictured embodiment, a columnar area near the center of the die (shown shaded in FIG. 1) is used for configuration, clock, and other control logic.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

Figure 2A:
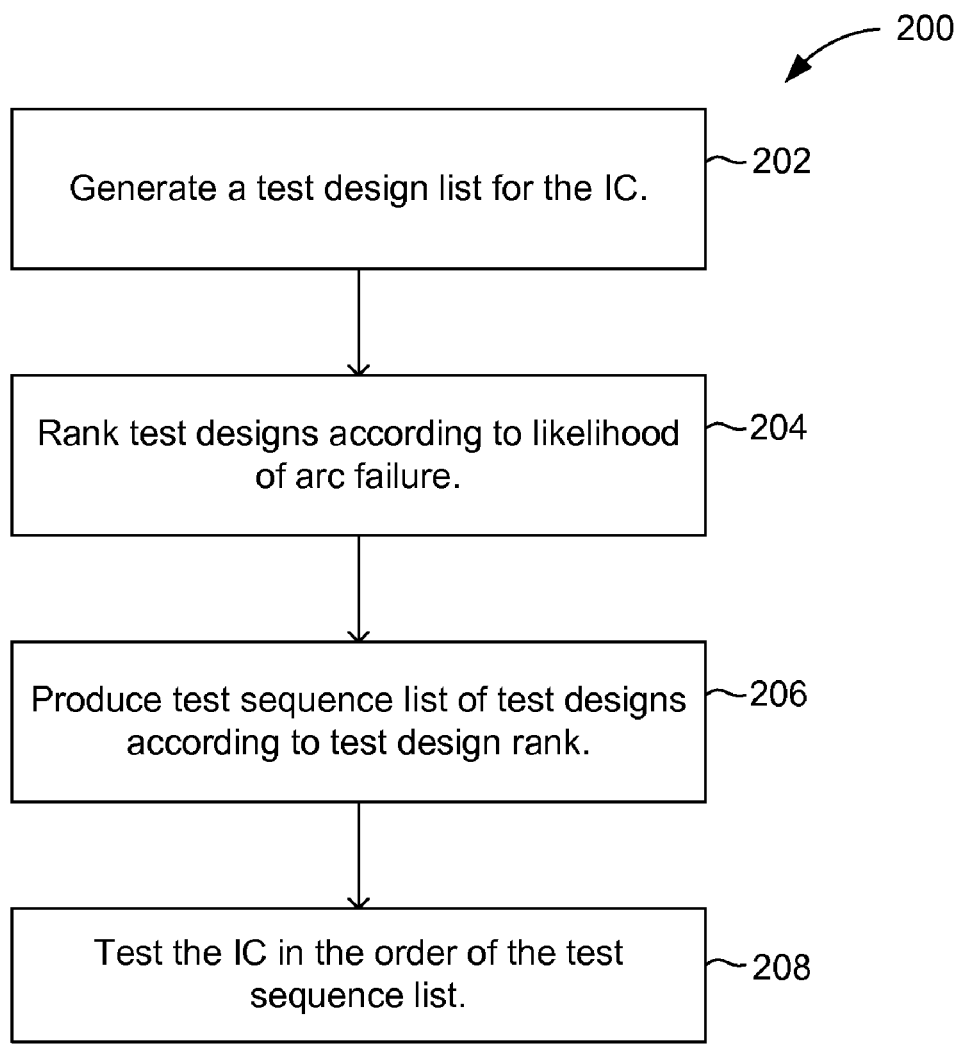
FIG. 2A is a flow chart of a method of testing an IC according to an embodiment.

FIG. 2A is a flow chart of a method 200 of testing an IC according to an embodiment. A test generator generates a test design list for testing arcs in the routing fabric of the IC (step 202). A ranking tool ranks the test designs on the test design list according to the likelihood of detecting an arc failure(s) in each test design during electrical test (step 204).

In a particular embodiment, the likelihood of detecting an arc failure is defined by the number of untested arcs in each arc design. As each test design is run on the IC, the arcs in that test design are exercised. An untested arc is an arc that is used in test design that was not previously used in an earlier test design in the test sequence. The first-ranked test design is the test design having the greatest number of arcs, since no arcs have been tested. The test design having the second greatest number of untested arcs might not be the next-ranked test design because many of the arcs would already be tested when the first-ranked test design is run. As the test designs are ranked, a test sequence is generated wherein each next-ranked test design has the greatest number of untested arcs. In a particular embodiment, a record, such as a bit string or file, of the tested arcs is accumulated as test designs are added to the test sequence. Each remaining test design is evaluated against the record of already-tested arcs to determine the next-ranked test design, which is added to the test sequence list until all test designs are listed.

In a further embodiment, if two unranked test designs have the same number of untested arcs, weighting factors are applied to arcs in the IC according to the empirically determined likelihood that a particular arc will fail during chip testing or field applications. For example, if arc A is known, from data collected during electrical test or chip use, for example, to be twice as likely to fail as arc B, arc A is assigned a weighting factor of two, while arc B is assigned a weighting factor of one. When a first test design having N untested arcs, including untested arc A, is ranked with a second test design also having N untested arcs, including untested arc B, the first test design will be ranked higher than the second test design because arc A has a higher weighting factor than untested arc B. Assigning weighting factors to the arcs in the IC is done before the test designs are ranked.

In an alternative embodiment, weighting factors are assigned to the arcs in the IC, and ranking of the test designs is done according to the highest (or lowest, depending on how weighting is implemented) total weighting score.

After ranking the test designs in the test design list according to likelihood of discovering an arc failure during test, a test sequence list is produced listing the test designs according to their ranking (step 206), and a tester tests the IC in the order of the test sequence list (step 208).

Figure 2B:
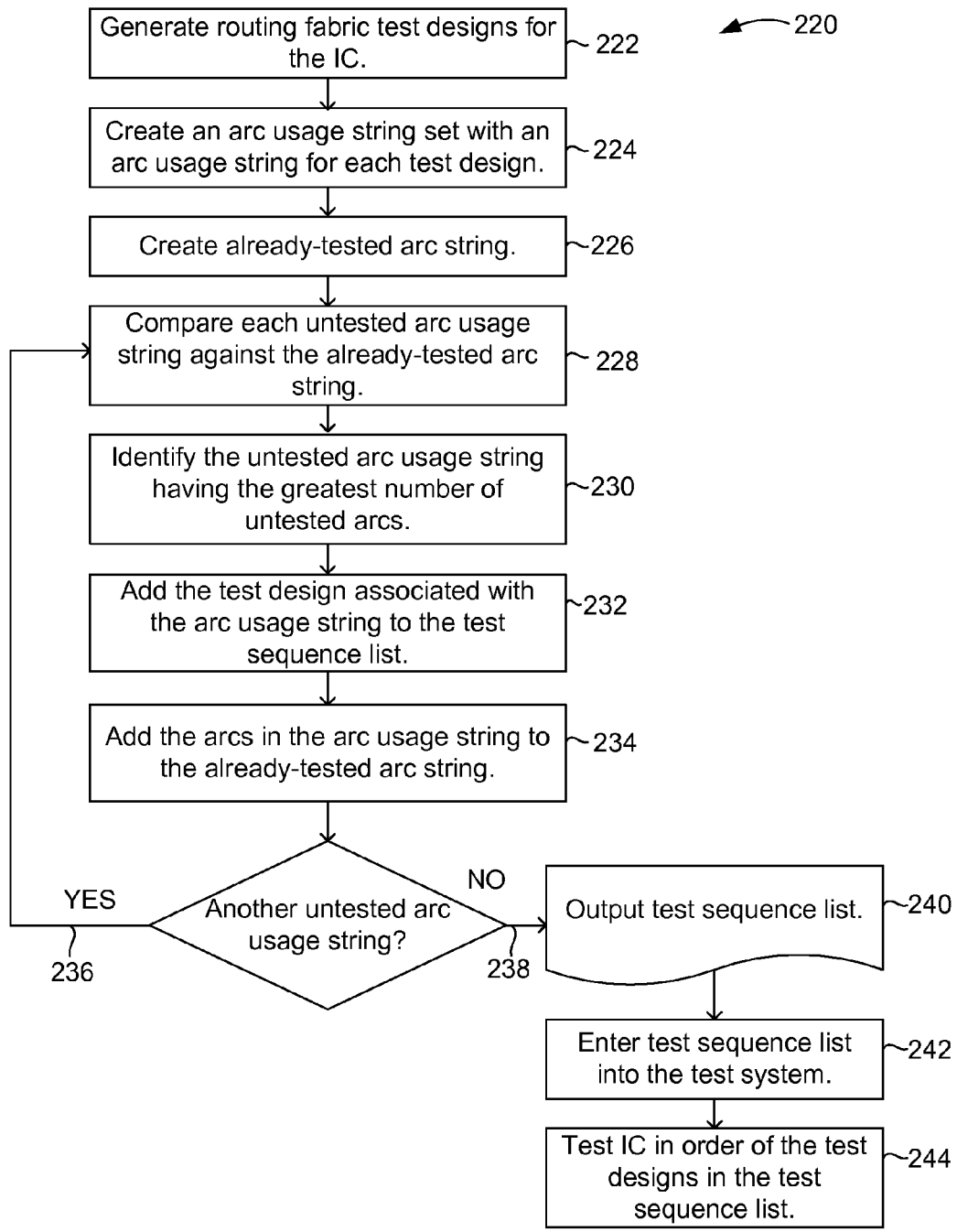
FIG. 2B is a flow chart of a method of testing an IC according to another embodiment.

FIG. 2B is a flow chart of a method of testing an IC 220 according to another embodiment. A test design tool generates a list of test designs for the IC, which has a routing fabric including user selectable arcs (step 222), as is done during conventional testing. A test design is a design that uses arcs via routing in a routing pattern that tests the arcs of interest to the test design engineer. Typically, patterns are used to generate designs that test more arcs than could be covered by using an application (end user) design. An arc usage bit string is created for each test design to produce a set of arc usage bit strings which is essentially randomly ordered (step 224).

The order of test designs generated by the test design tool is typically not the optimal order for testing the IC. Embodiments rank the test designs according to the likelihood of finding a defective arc in the test design so that those test designs are run earlier in the test sequence. In one embodiment, the test designs are ranked according to the number of arcs that remain untested in the IC after each test design is run during device test. Testing the greatest number of arcs early in the test process reduces the average test time for failed parts and provides superior testing without using empirical test data.

In an alternative or further embodiment, the arcs in each test design are ranked according to a likelihood of failure, which is determined by empirical testing (i.e., arc failures during test) or application failures. Commonly owned U.S. Pat. No. 7,227,364 entitled, "Test Circuit For and Method of Identifying a Defect in an Integrated Circuit," issued Jun. 5, 2007 to Fan et al., the disclosure of which is hereby incorporated in its entirety for all purposes, describes techniques for ranking based on likelihood of failure. For example, metal lines that are more likely to have defects are identified, and the ranker weights certain arcs according to whether those particular metal lines are used.

In a particular embodiment, each arc usage bit string has a number of bits equal to the number of arcs being tested. For example, if the IC has one million arcs, each arc usage bit string has one million bits, one bit for each of the arcs in the IC. Different types of ICs have different numbers of user-accessible arcs, so different ICs would have a different number of bits in each arc usage bit string; however, in a particular embodiment, all arc usage bit strings (typically representing about 100 to about 300 test designs) have a number of bits equal to the number of arcs being tested.

An already-tested arc bit string is generated (226). In a particular embodiment, untested arcs are assigned a first value (e.g., zero) and the arcs that will be exercised when an associated test design is run are assigned a second value (e.g., one), and all the bits in the already-tested arc bit string are initially set to the first value. As an arc usage string is ranked and the associated test design added to the test sequence list, the arcs exercised by that test design are added to the already-tested arc bit string so that the arcs tested by successive designs are accumulated. In an alternative embodiment, arcs are assigned unique identifiers, such as ASCII arc names as a way of keeping track of arcs used in test designs, or a file is created, similar to a pattern generator binary usage ("BUS") file. Usage files provide an integer value for each arc, which allows a ranking or a number-of-times-tested to be associated with each arc. Further details on techniques of listing routing resources are found in commonly owned U.S. Pat. No. 7,058,919 B1, issued Jun. 6, 2006 to Young et al., the disclosure of which is hereby incorporated in its entirety for all purposes.

Each untested arc usage bit string is compared against the already-tested arc bit string (step 228). In a particular embodiment, A=already_tested_bit_string and B=$N^{th}$_test_design_bit_string. A binary subtraction of A from B will identify the untested arcs in B, and hence the number of untested arcs in B. This can be done for all the remaining test design bit strings to identify the remaining test design with the greatest number of un-tested arcs. In binary arithmetic, Temp=B & A; B=B XOR Temp. Other operations are alternatively performed to compare the test design bit strings to the already tested bit string.

The untested arc usage bit strings (i.e., the arc usage strings associated with test designs not yet added to the test sequence list) are evaluated to identify the arc usage bit string with the highest number of untested arcs (step 230). The first-ranked arc usage bit string is the one having the greatest number of arcs, since the already-tested arc bit string is empty. It is important to note that the second-ranked test design is not necessarily the test design with the second highest number of arcs. For example, a test design with a high number of arcs but substantially overlapping the first-ranked test design might have a low number of un-tested arcs and would be ranked lower than a smaller test design (fewer arcs) that had a greater number of untested arcs. Arc usage bit strings that have been added to the already-tested arc bit string or file are identified by flagging those arc usage bit strings or removing them from the arc usage bit sting list, for example.

The test design associated with the identified arc usage bit string is added to the test sequence list (step 232) and the arcs in the arc usage bit string are added to the already-tested arc bit string or list (step 234). The process repeats (branch 236) until all the arc usage strings have been added to the test sequence list (branch 238), in other words, until all test designs have been ranked.

The test sequence list is output (step 240) and entered into the IC test system (step 242). The IC is tested in the order of the test designs in the test sequence list (step 244). Since the test designs are executed by the tester in order of which test design uses the most untested arcs, the test sequence is more likely to find failures earlier in the test process compared to conventional unranked test sequences.

In some embodiments, the test sequence list exceeds the capacity of the test system for a single test sequence. The number of test designs needed to completely test all arcs of the IC are split into top portion of the test sequence list and a bottom portion of the test sequence list, and the top portion of the test sequence list is run on the tester first.

Figure 3:
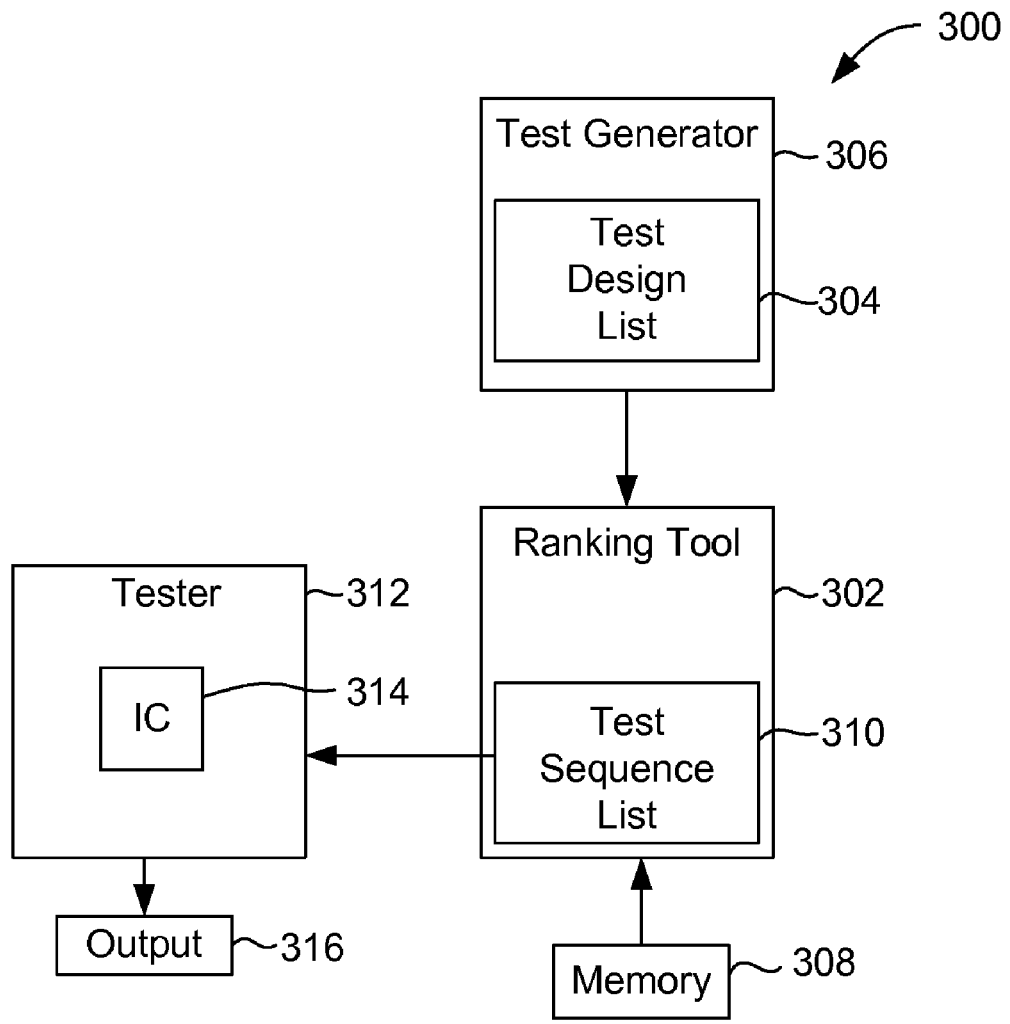
FIG. 3 is a diagram of a test system according to an embodiment.

FIG. 3 is a diagram of a test system 300 according to an embodiment. A ranking tool 302 according to an embodiment accepts an unranked list of test designs 304 for an IC from a conventional test design tool 306. The test design tool keeps track of which arcs have been incorporated in which test designs (routing circuits), and keeps generating test designs until all arcs are utilized in at least one test design.

In a particular embodiment, the ranking tool 302 is a general-purpose computer configured according to a computer-readable memory 308 to rank the user designs substantially as described above in reference to FIG. 2 to produce a test sequence list 310. The test sequence list 310 is provided to a tester 312 that tests the routing fabric of a physical IC device 314 in a sequence according to the test sequence list 310. The memory 308 is an external memory, such as a magnetic disk drive or optical disk, or an internal memory (not shown), such as RAM. In some embodiments, the tester 312 includes a computer (not separately shown). In a particular embodiment, the general-purpose computer used to rank the user designs and produce a test sequence list also runs a test application that drives the tester.

The tester 312 provides an output 316 (e.g. a screen display or printed record) indicating whether the IC 314 passed or failed the routing test (i.e., the test sequence). In a particular embodiment, the test sequence list is output (displayed). In a further embodiment, the output 316 includes information indicating what portion of the routing fabric failed. In a further embodiment, additional tests are run to pin-point which ARC failed.

In one embodiment, testing of the IC 314 is stopped when a test design fails and the IC device is failed. Alternatively, testing continues after recording the failure and the IC is binned after testing according to its test results. For example, an IC with no failed arcs is binned to one part number, while ICs having one or more failed arcs are binned to other part numbers. The configurable nature of FPGAs allows the portion(s) of the FPGA containing the failed arc(s) to be blocked out (i.e., not available to the user), while still providing substantial functionality.

What is claimed is:

1. A method of testing an integrated circuit ("IC") comprising:
    generating a test design list having a plurality of test designs to test arcs in a routing fabric of the IC;
    ranking each test design according to a likelihood of finding an arc failure, and further according to a number of untested arcs in each test design;
    producing a test sequence list of test designs according to the ranking; and
    testing the IC, using a physical test system, in order of the test sequence list.

2. The method of claim 1 wherein a first-ranked test design has a greatest number of arcs in the plurality of test designs and wherein a second-ranked test design does not have a second-greatest number of arcs in the plurality of test designs.

3. The method of claim 1 further comprising
    creating an arc usage string list having a plurality of arc usage strings corresponding to the plurality of test designs, wherein a first-ranked test design has a greatest number of arcs in a first-ranked arc usage string and each remaining arc usage string is compared to the first-ranked arc usage string to identify a next-ranked arc usage string having a greatest number of untested arcs.

4. A method of testing an integrated circuit ("IC") comprising:
  generating a test design list having a plurality of test designs to test arcs in a routing fabric of the IC;
  creating an arc usage string set having a plurality of arc usage strings corresponding to the plurality of test designs;
  assigning weighting factors to arcs of the IC according to empirical arc failure data;
  ranking each test design according to a likelihood of finding an arc failure, wherein the ranking includes evaluating the weighting factors;
  producing a test sequence list of test designs according to the ranking; and
  testing the IC, using a physical test system, in order of the test sequence list.

5. The method of claim 1 wherein the test design list includes test patterns, and the test patterns in the test design list test all user-selectable arcs in the IC.

6. The method of claim 5 further comprising a step of identifying a failed arc after the IC fails testing.

7. A test system comprising:
  a test generator configured to output a test design list for testing arcs in a routing fabric of an integrated circuit ("IC");
  a ranking tool configured to rank test designs in the test design list according to a number of untested arcs in each test design and produce a test sequence list that orders the test designs in order of a test design having a greatest number of untested arcs to a test design having a least number of untested arcs; and
  a tester testing the arcs in the routing fabric of the IC by executing the test designs in order of test designs in the test sequence list,
  wherein the tester comprises a physical test system.

8. The test system of claim 7 wherein the ranking tool comprises a general purpose computer and further including a non-transitory computer-readable medium for configuring the general purpose computer to rank test patterns in a test design list of an integrated circuit ("IC"), the computer-readable medium having
  computer readable instructions stored in the computer-readable medium for creating an arc usage string for each of the test patterns in the test design list;
  ranking the test patterns according to a number of untested arcs in each arc usage string; and
  producing a test sequence list of test patterns, a first test pattern having a greatest number of untested arcs and a last test pattern having a least number of untested arcs.

9. The test system of claim 7 wherein the test generator comprises the general purpose computer.

* * * * *